(12) United States Patent
Russell et al.

(10) Patent No.: US 7,982,475 B2
(45) Date of Patent: Jul. 19, 2011

(54) STRUCTURE AND METHOD FOR RELIABILITY EVALUATION OF FCPBGA SUBSTRATES FOR HIGH POWER SEMICONDUCTOR PACKAGING APPLICATIONS

(75) Inventors: David J Russell, Owego, NY (US); Ronald S Malfatt, LaGrangeville, NY (US); Stefano S Oggioni, Milan (IT); Jamil A Wakil, Buchanan Dam, TX (US)

(73) Assignee: International Business Machines Corporation, Armonk, NY (US)

( * ) Notice: Subject to any disclaimer, the term of this patent is extended or adjusted under 35 U.S.C. 154(b) by 943 days.

(21) Appl. No.: 11/307,828

(22) Filed: Feb. 24, 2006

(65) Prior Publication Data

US 2007/0202616 A1    Aug. 30, 2007

(51) Int. Cl.
*G01R 31/02* (2006.01)
(52) U.S. Cl. .................................. 324/750.03
(58) Field of Classification Search .................. None
See application file for complete search history.

(56) References Cited

U.S. PATENT DOCUMENTS

| | | | | |
|---|---|---|---|---|
| 3,253,221 A * | 5/1966 | Peckover | | 324/767 |
| 4,373,316 A * | 2/1983 | Kobayashi | | 53/67 |
| 4,577,149 A | 3/1986 | Zbinden | | |
| 5,164,699 A | 11/1992 | Smith et al. | | |
| 5,172,063 A | 12/1992 | Munikoti et al. | | |
| 5,260,668 A * | 11/1993 | Mallory et al. | | 324/719 |
| 5,268,558 A | 12/1993 | Youssef et al. | | |
| 5,473,259 A * | 12/1995 | Takeda | | 324/760 |
| 5,896,259 A * | 4/1999 | Farwell et al. | | 219/209 |
| 6,114,674 A | 9/2000 | Baugh et al. | | |
| 6,225,141 B1 | 5/2001 | Wenner et al. | | |
| 6,348,807 B2 * | 2/2002 | Black | | 324/765 |
| 6,486,450 B1 | 11/2002 | Quinlan et al. | | |
| 6,606,251 B1 * | 8/2003 | Kenny et al. | | 361/764 |
| 6,621,055 B2 | 9/2003 | Weber et al. | | |
| 6,678,168 B2 * | 1/2004 | Kenny et al. | | 361/764 |
| 6,825,681 B2 * | 11/2004 | Feder et al. | | 324/760 |
| 6,847,010 B1 * | 1/2005 | Hsieh et al. | | 219/209 |
| 6,882,543 B2 * | 4/2005 | Kenny et al. | | 361/764 |
| 7,061,104 B2 * | 6/2006 | Kenny et al. | | 257/714 |
| 7,129,726 B2 * | 10/2006 | Tashiro et al. | | 324/754 |
| 7,612,439 B2 * | 11/2009 | Zhang et al. | | 257/676 |
| 2001/0013789 A1 * | 8/2001 | Black | | 324/765 |
| 2002/0014894 A1 * | 2/2002 | Yonezawa et al. | | 324/760 |
| 2006/0238186 A1 * | 10/2006 | Nishikawa et al. | | 324/71.1 |
| 2007/0145609 A1 * | 6/2007 | Zhang et al. | | 257/E23.037 |
| 2007/0202616 A1 * | 8/2007 | Russell et al. | | 438/15 |
| 2008/0302783 A1 * | 12/2008 | Wong et al. | | 324/760 |

* cited by examiner

*Primary Examiner* — Jermele M Hollington
(74) *Attorney, Agent, or Firm* — Ohlandt, Greeley, Ruggiero & Perle, LLP; Joseph P. Abate

(57) ABSTRACT

There is provided a method for measuring thermal properties of a semiconductor packaging material. The method includes incorporating at least one conducting feature into a substrate that includes the semiconductor packaging material, applying an electric current to the feature, and measuring a change in temperature of a region of the substrate around the feature as a result of the electric current. There is also provided a test vehicle for measuring thermal properties of a semiconductor packaging material.

11 Claims, 17 Drawing Sheets

STRUCTURE AND METHOD FOR RELIABILITY EVALUATION OF FCPBGA SUBSTRATES FOR HIGH POWER SEMICONDUCTOR PACKAGING APPLICATIONS

BACKGROUND OF THE INVENTION

1. Field of the Invention

The present invention relates to methods and devices for testing substrate materials, and more particularly, to methods and devices for testing semiconductor packaging materials.

2. Description of the Related Art

The use of build-up organic substrates for semiconductor packaging, such as flip chip plastic ball grid array (FCPBGA), is increasing. One area in which FCPBGA is being applied is the area of high power processors. Typical applications for FCPBGA involve processor chips with a power requirement of 45 watts or less. Recent applications requiring chips up to 100 W, and applications under development requiring power in excess of 200 W, have raised concerns about the reliability of the organic build-up laminate substrates used for chip packaging.

Typically thermal evaluations of high power chips are accomplished by fabricating high resistance heaters in the chip, so that a low amount of current can be used to power the heaters and thereby control the amount of heat generated by the chip. Such an approach does not satisfy the concerns raised for high power applications because the low amount of current needed to heat the chip is not representative of the currents that may pass through laminates of chips and interconnects in actual high power applications.

Because of this use of chips in high power applications, there is a significant effort to cool chips and interconnects to a specified temperature, typically 85° C. or lower. However, passing high current through fine conductive copper features in the laminate can potentially add more heat to the packaging laminate under the chip due to resistive heating.

Therefore, there is a need to provide a device and method to determine effects on characteristics of substrates used in packaging high power chips. Such characteristics include additional heating occurring inside the organic packaging substrate as a result of resistive heating of the conductive features when high currents are passed through the conductive features. Other characteristics include the long term reliability of the organic laminate making up the packaging, as it is subjected to these high currents for extended periods of time, and the long term reliability effects of having the organic laminate subjected to repeated heating and cooling experienced during on-off power cycles. The present invention addresses these needs.

SUMMARY OF THE INVENTION

It is an object of the present invention to provide a device and method for evaluating high power semiconductor packaging.

It is another object of the present invention to provide such a structure and method for measuring heating of a packaging substrate as a result of current applied to features in the substrate.

It is a further object of the present invention to provide such a structure and method for measuring the long term reliability implications of heating of a packaging laminate over a period of time.

It is still a further object of the present invention to provide such a structure and method for measuring the long term reliability implications of heating of a packaging laminate subject to repeated on-off power cycles.

These and other objects of the present invention are achieved by a method for measuring thermal properties of a semiconductor packaging material. The method includes incorporating at least one conducting feature into a substrate that includes the semiconductor packaging material, applying an electric current to the feature, and measuring a change in temperature of a region of the substrate around the feature as a result of the electric current. The present invention also provides a test vehicle for measuring thermal properties of a semiconductor packaging material.

DESCRIPTION OF THE INVENTION

Figure 1:
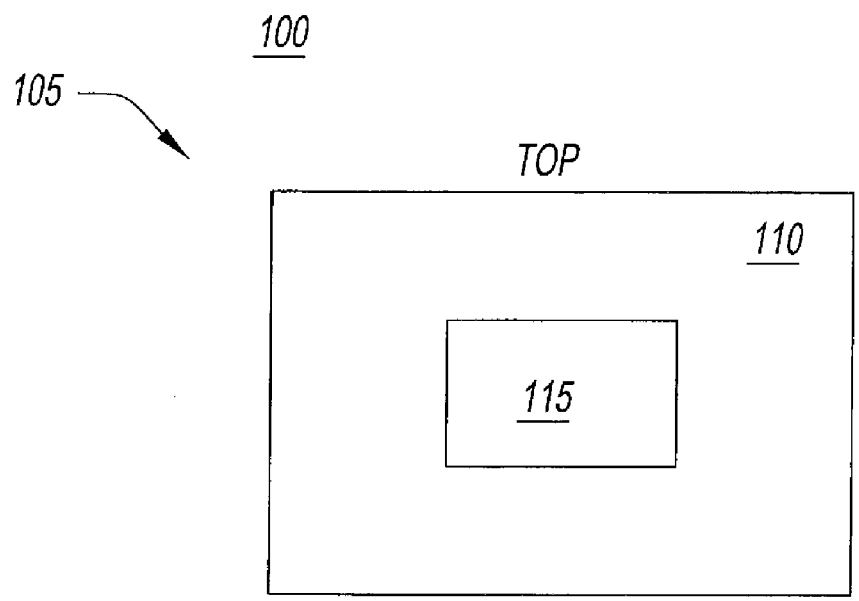
FIG. 1 is a top and bottom view of an embodiment of a test vehicle 100.
Figure 1:
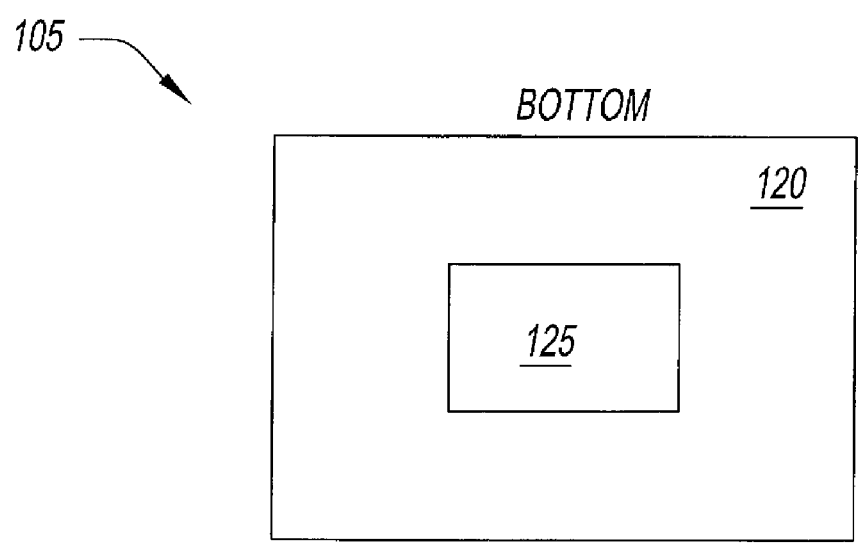

Referring to the drawings and, in particular, FIG. 1, there is provided an embodiment of a test vehicle of the present invention, for measuring thermal properties of packaging material for a semiconductor chip, generally represented by reference numeral 100.

"Substrate" is a generic term for various types of electronic chip carriers constructed between a chip, i.e., a die, and a printed circuit board. Laminate carriers generally refer to substrates made from organic materials and come in many different varieties.

Test vehicle 100 includes a SLC™ (Surface Laminar Circuit) build up (BU) technology laminate substrate 105, into which is incorporated at least one conducting feature (not shown). Build up technology uses sequentially added layer to an already formed multilayer rigid central Printed Circuit Board (PCB) structure conventionally named a "core". Test vehicle 100 also includes a temperature sensing line (not shown) in the substrate, and a measurement device (not shown) connected to the temperature sensing line for measuring a change in temperature of a region of the substrate around one or more of the features as a result of the electric current. Test vehicle 100 has features both under the die area and outside of the die area. Positioning test vehicle features both under and outside the die area allows test vehicle 100 to be used to measure a gradient of heat contribution from the die into the laminate.

Test vehicle 100 can be used to detect and measure "micro effects", i.e. local effects of a heated conductor on substrate material. Micro effects are effects of individual test features, and measurement of these micro effects are used to define the contribution from the laminate as compared to contributions from the semiconductor chip. Test vehicle 100 is also useful for measuring "area effects", i.e. chip (die) contribution to overheating of restricted laminate areas, and "macro effects", i.e. temperature of the test vehicle vs. aging of the substrate material.

Features are located in test vehicle 100, and are constructed to replicate typical and preferred laminate features in four main areas of the substrate. These areas are generally represented by area 110, 115, 120 and 125. Area 110 is an area including the top build-up (BU) layers of substrate 105 away from the chip, area 120 is an area including the bottom BU layers away from the chip shadow area, area 115 is an area including the top BU layers and under the chip, and area 125 is an area including the bottom BU layers and under the chip shadow. Substrate 105 preferably includes an organic material, and is constructed of the same materials as would make up a selected semiconductor packaging laminate.

Area 115 may include structures to monitor interconnection behavior between the semiconductor and the substrate used in packaging, while areas 120 and 125 may include structures to monitor interconnection behavior between the finished electronic module, including the semiconductor chip and the packaging, and the application board.

Figure 2:
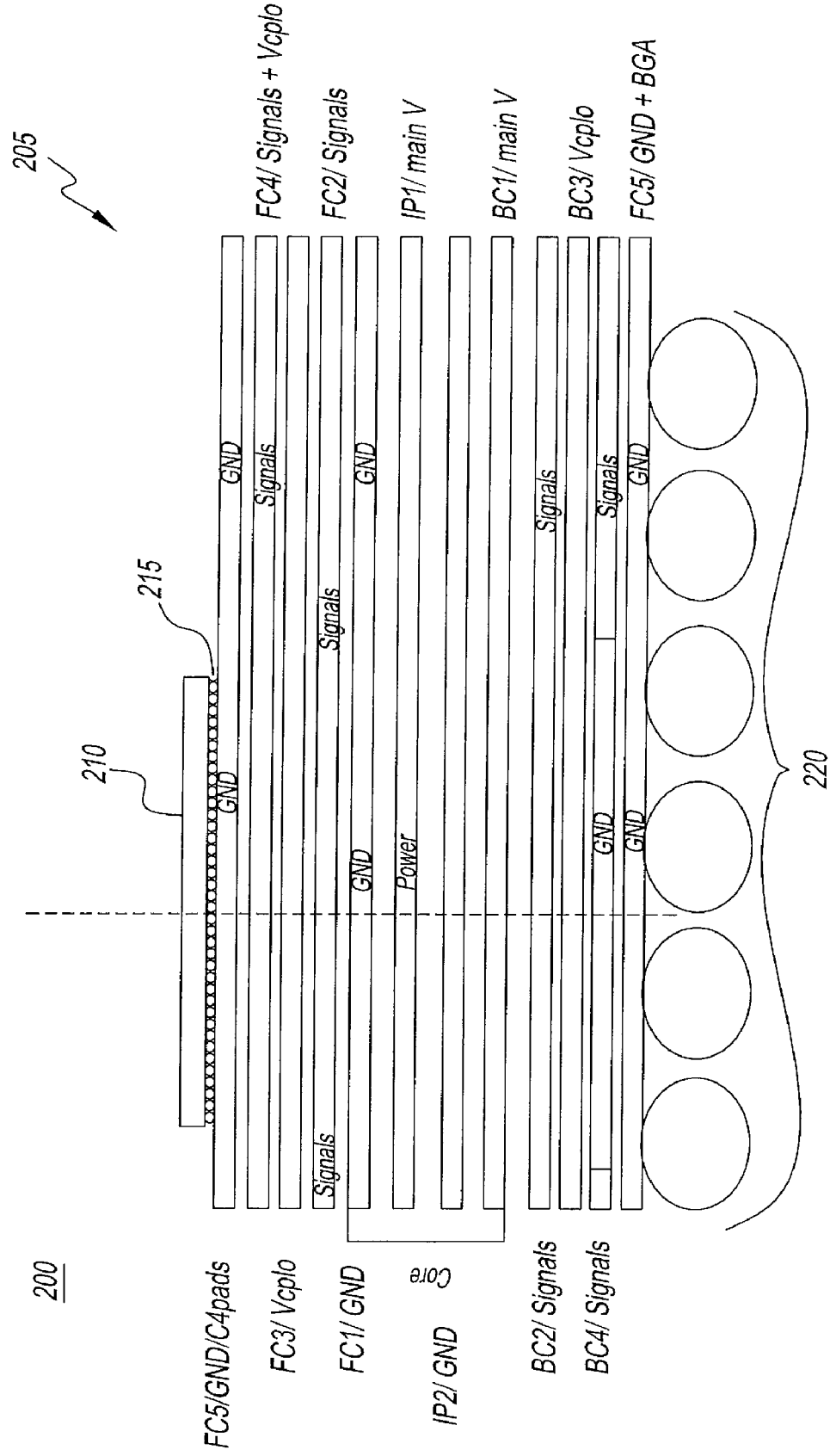
FIG. 2 is a cross section view of part of a flip chip ball grid array packaging assembly.

Test vehicle substrate 105 is constructed of the same material as packaging substrate 205 shown in FIG. 2 and features identical or similar features as does packaging substrate 205. In this way, test vehicle substrate 105 at least substantially replicates the construction and features of packaging substrate 205. As a result, temperature changes measured in test vehicle substrate 105 under certain conditions allow for prediction of temperature changes that would occur in packaging substrate 205 under similar conditions.

Referring to FIG. 2, a cross section of part of a flip chip ball grid array packaging assembly 200 is shown, demonstrating the multi-layer construction of packaging substrate 205. A semiconductor chip 210, also referred to as a die 210, is mounted on substrate 205 via die mounting array 215. Substrate 205 is further mounted on ball grid array (BGA) 220.

Substrate 205 includes core layers conventionally named as FC1, IP1, IP2 and BC1. Layer FC1 is the top layer of the core, layers IP1 and IP2 are central layers of the core, and BC1 is the bottom layer of the core. Layers FC2, FC3, FC4 and FC5 are the top build up layers of substrate 205, and layers BC2, BC3, BC4 and BC5 are the bottom build up layers of substrate 205. Various features (not shown) and sensing lines (not shown) are built in these layers, particularly layers FC1-FC5 and BC1-BC5. In a preferred embodiment, each layer is made from an organic material.

The features incorporated into test vehicle 100 are conducting features formed in one or more of the layers of substrate 205, and include one or more of the following types of features: a) micro-vias, usually constructed to connect circuit features across different build up layers, b) lines placed along the different stacked layers, c) through holes used to connect "through" the different layers belonging to the central core, and d) resin filled plated (RFP) through holes having similar functions as through holes c). All of the above-mentioned features can be manufactured by selective etching or plating, laser, plasma or mechanical drilling, or combinations of different techniques.

Figure 3A:
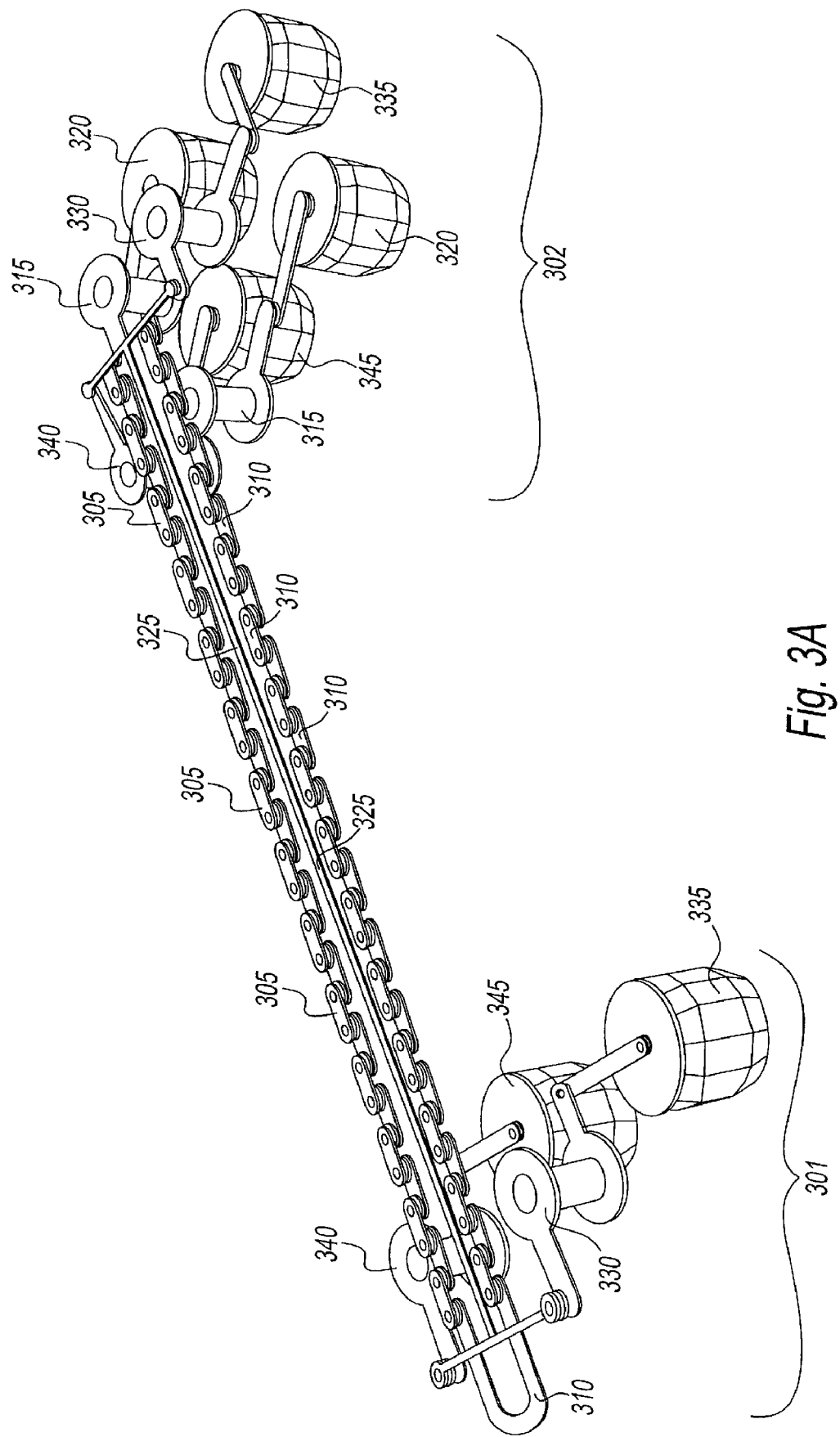
FIG. 3A is a perspective view of an embodiment of the features and test measurement line of test vehicle 100.
Figure 3B:
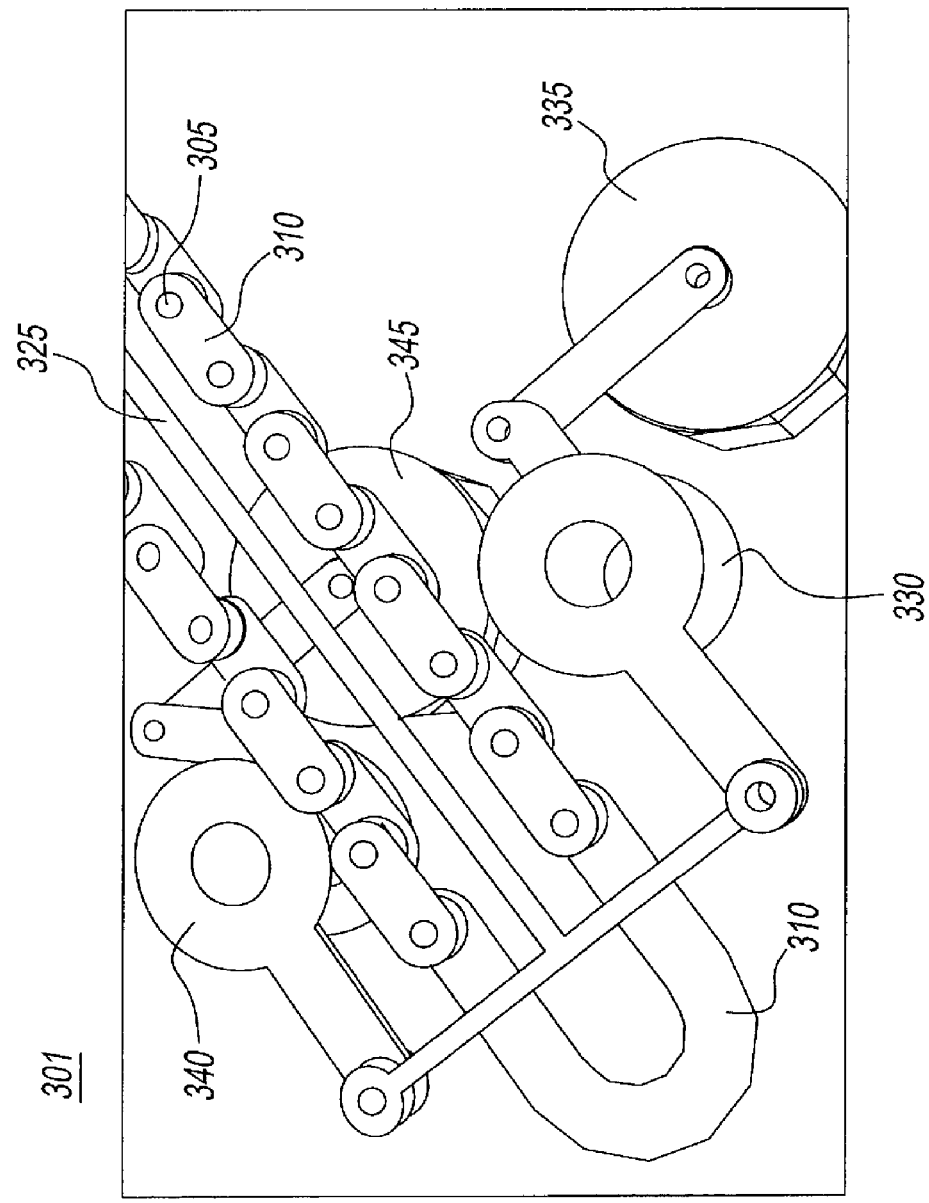
FIG. 3B is a close-up of a region 301 of the embodiment of test vehicle 100 shown in FIG. 3A.
Figure 3C:
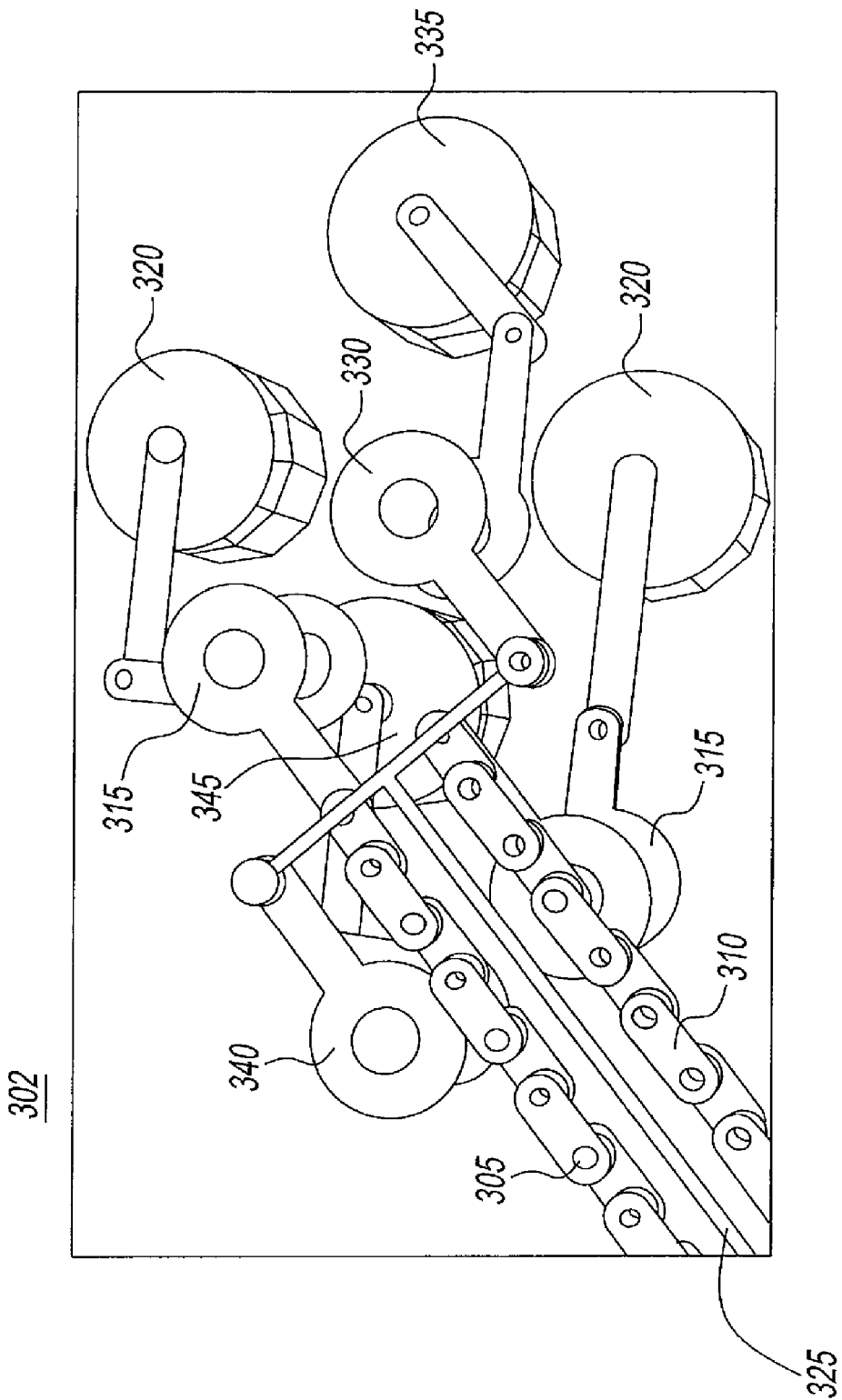
FIG. 3C is a close-up of a region 302 of the embodiment of test vehicle 100 shown in FIG. 3A.

Referring to FIGS. 3A-3C, an embodiment of the features incorporated in test vehicle 100 is shown. Test vehicle 100 includes a first end region 301 and a second end region 302. FIG. 3A is a three-dimensional representation of the conductive features in the form of multiple micro-vias 305 connected in series, i.e., in a daisy chain connection, by connections 310. Micro-vias 305 are electrically connected through RFP vias 315 and features 320 to an electric current source. Feature 320 can be a metal pad hosting a solder sphere (as used in Ball grid arrays), a metal pin (as used in Pin grid arrays, PGA) or a column (as used in Column grid array). Feature 320 can be made from different kind of metals and alloys such as Copper, and alloys using such metals as copper, Nickel, Iron, Gold, and Silver. Examples of such alloys include Bronze, brass, and Alloy 42. Feature 320 can also be made from soldering metals or alloys containing elements such as Sn, Au, Bi, In, Zn, and Cu. Feature 320 can also be an electrically conductive flat pad capable of being mated with connectors using a Pad-on-Pad connection (as used on a Land grid array, LGA).

A temperature sensing line 325 is located in the center of, or between the daisy chains of micro-vias 305, and provides a signal to a measurement device (not shown).

Figure 3D:
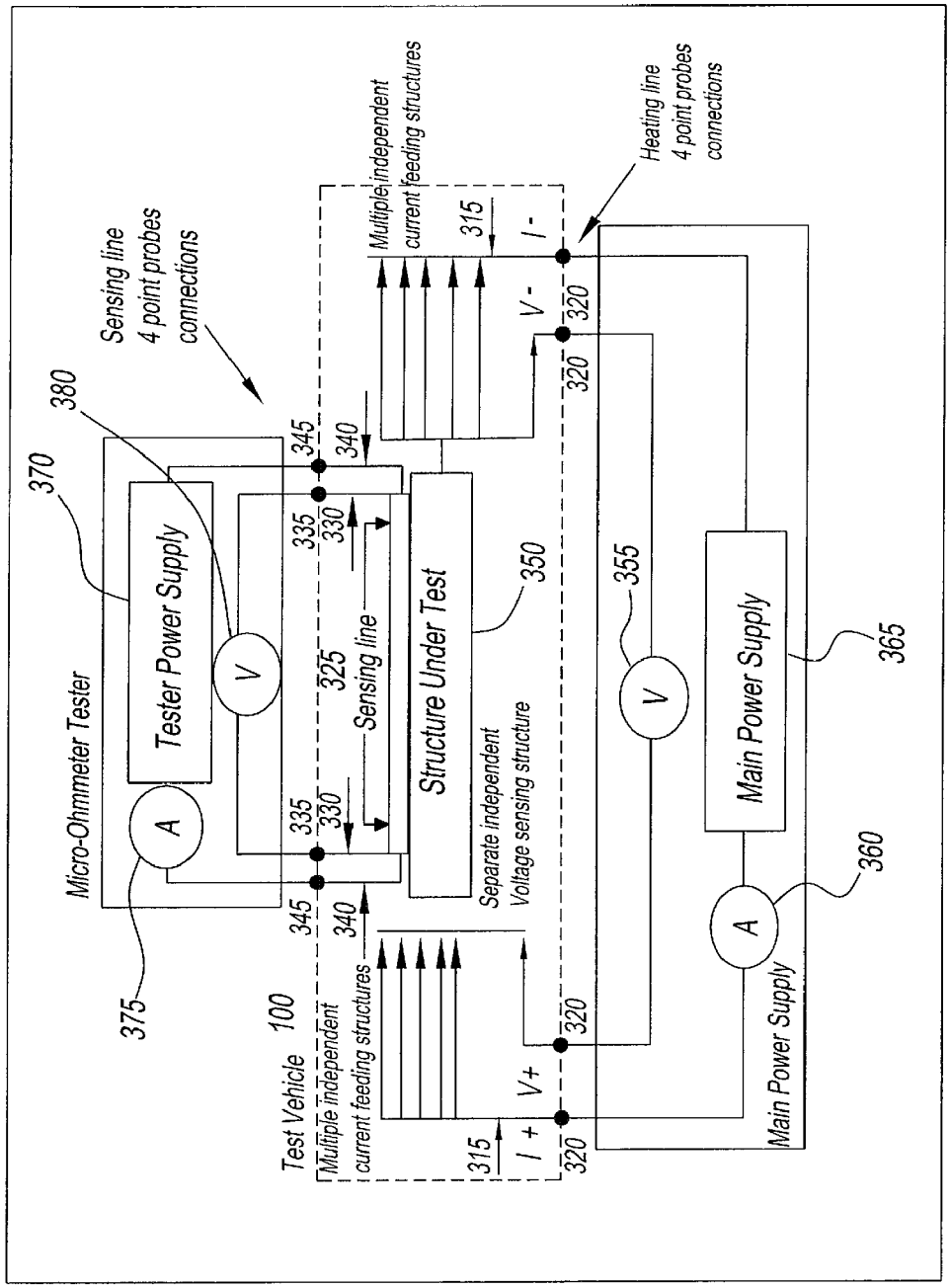
FIG. 3D is a schematic showing the temperature sensing lines as part of a four point probe testing system for power feeding the features and measuring temperature changes using a four probe microresistance measuring technique.

Preferably, in the implementation of specific experiments into the design of the Test vehicle, multiple connections for each specific function to be tested may be pursued. In the case of temperature sensing line feature 325, the line is connected through parallel but fully independent paths to multiple "external" contacts. This allows the use of a four point probe measurement technique monitoring the micro-resistance skew of the thin line induced by the neighboring temperature change. An example of a four point probe measurement setup is shown in FIG. 3D described below. Although the four point probe setup is shown in the context of the embodiment of the test vehicle shown in FIGS. 3A-3C, this setup can be used for any embodiments within the scope of the invention.

Similarly, the current feeding structures, such as RFP vias 315 and features 320, are generated with a level of redundancy to minimize any possible contribution to the targeted effect under evaluation. Multiple independent paths minimize the electrical resistance of the current feeding path generating a convergence of high current only into the structure under evaluation. Degradation of the current feeding elements can be still be monitored by applying insulation and/or resistance skew techniques.

FIG. 3B is a close-up of end region 301 of test vehicle 100. FIG. 3B shows micro-vias 305 and connections 310. FIG. 3B also shows a close-up view of temperature sensing line 325 as connected to vias 340 and features 345, and also as connected to vias 330 and features 335. FIG. 3C is a close-up view of end region 302 of test vehicle 100, and shows vias 315 and 320 connected to micro-vias 305 and connections 310.

Temperature sensing line 325, in one embodiment, is a component of a four-point probe used to measure changes in resistivity due to temperature changes in substrate 105 as a result of electric current applied to micro-vias 305.

Referring to FIG. 3D, micro-vias 305, included in the "Structure Under Test" 350 shown in FIG. 3D, are connected to vias 315 and features 320 which are in turn connected to a voltmeter 355, an ammeter 360 and to a power supply 365. Sensing line 325 is connected to vias 340 and features 345, which are connected to a tester power supply 370 and an ammeter 375. Sensing line 325 is also connected to vias 330 and features 335, which are connected to a voltmeter 380.

In a preferred embodiment, micro-vias 305, connections 310, vias 315, features 320, temperature sensing line 325, vias 330, features 335, vias 340 and features 345 are made from a conducting material such as copper.

Figure 4A:
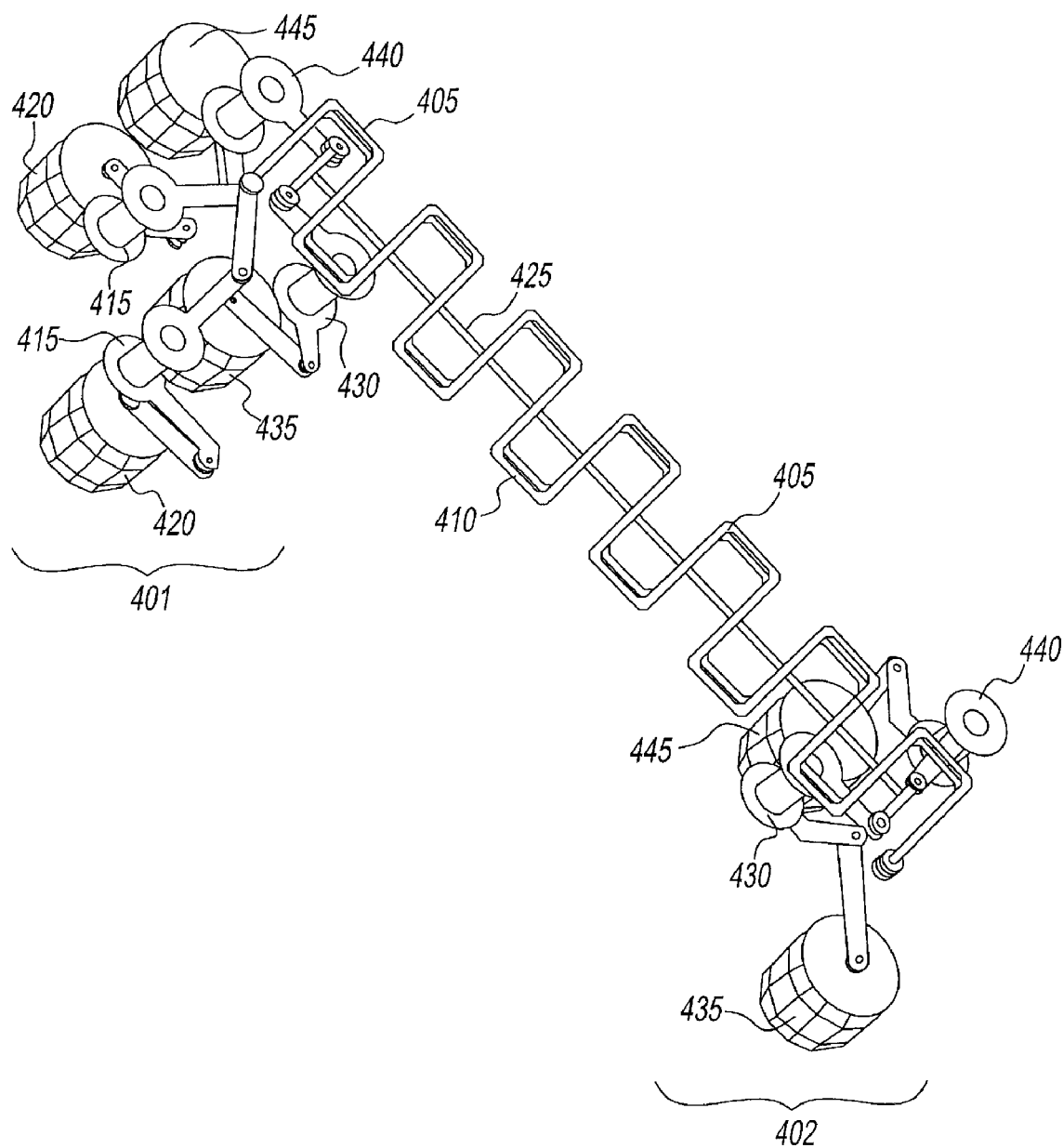
FIG. 4A is a perspective view of an embodiment of the features and test measurement line of test vehicle 100.
Figure 4B:
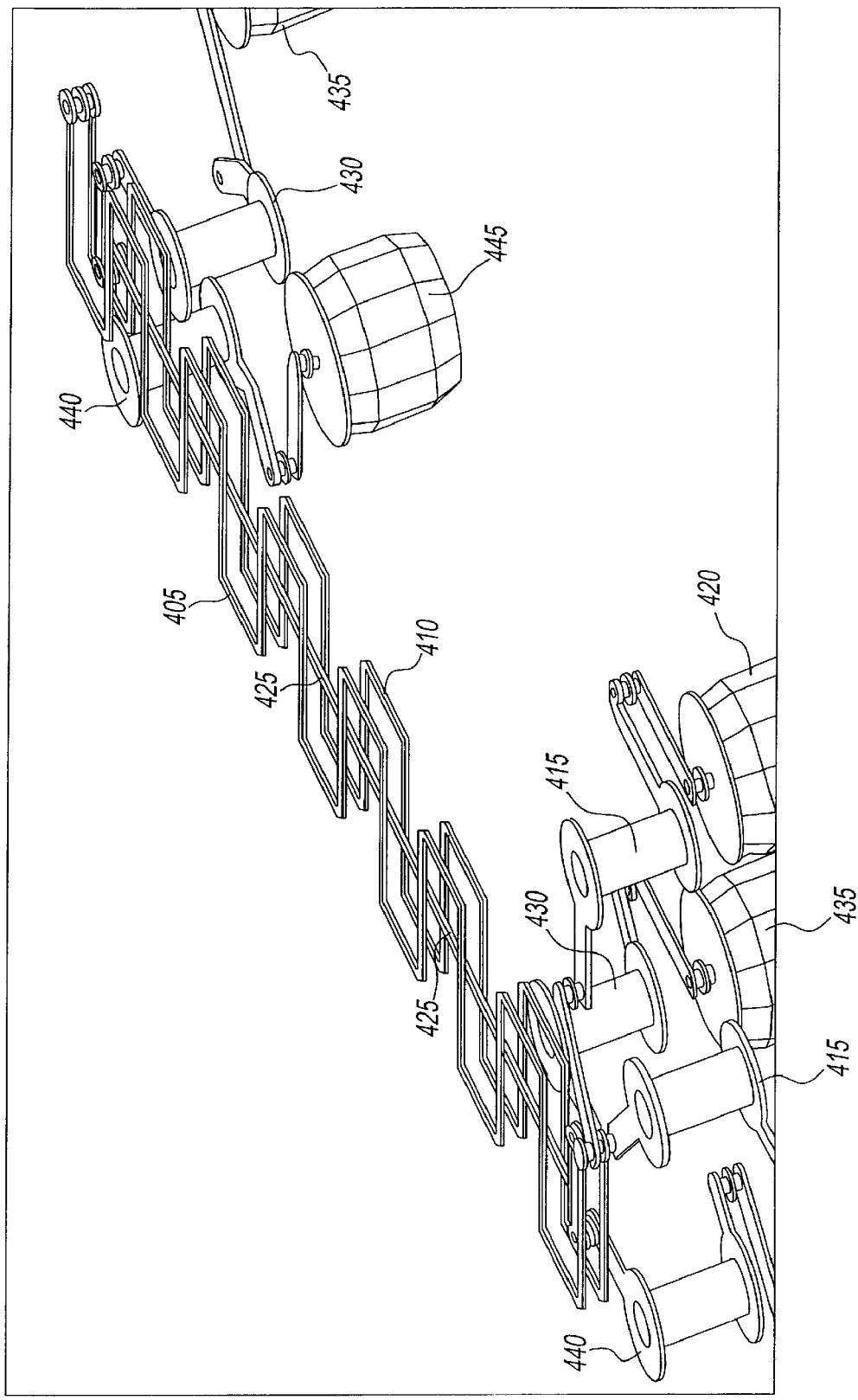
FIG. 4B is a close-up of the embodiment of test vehicle 100 shown in FIG. 4A.
Figure 4C:
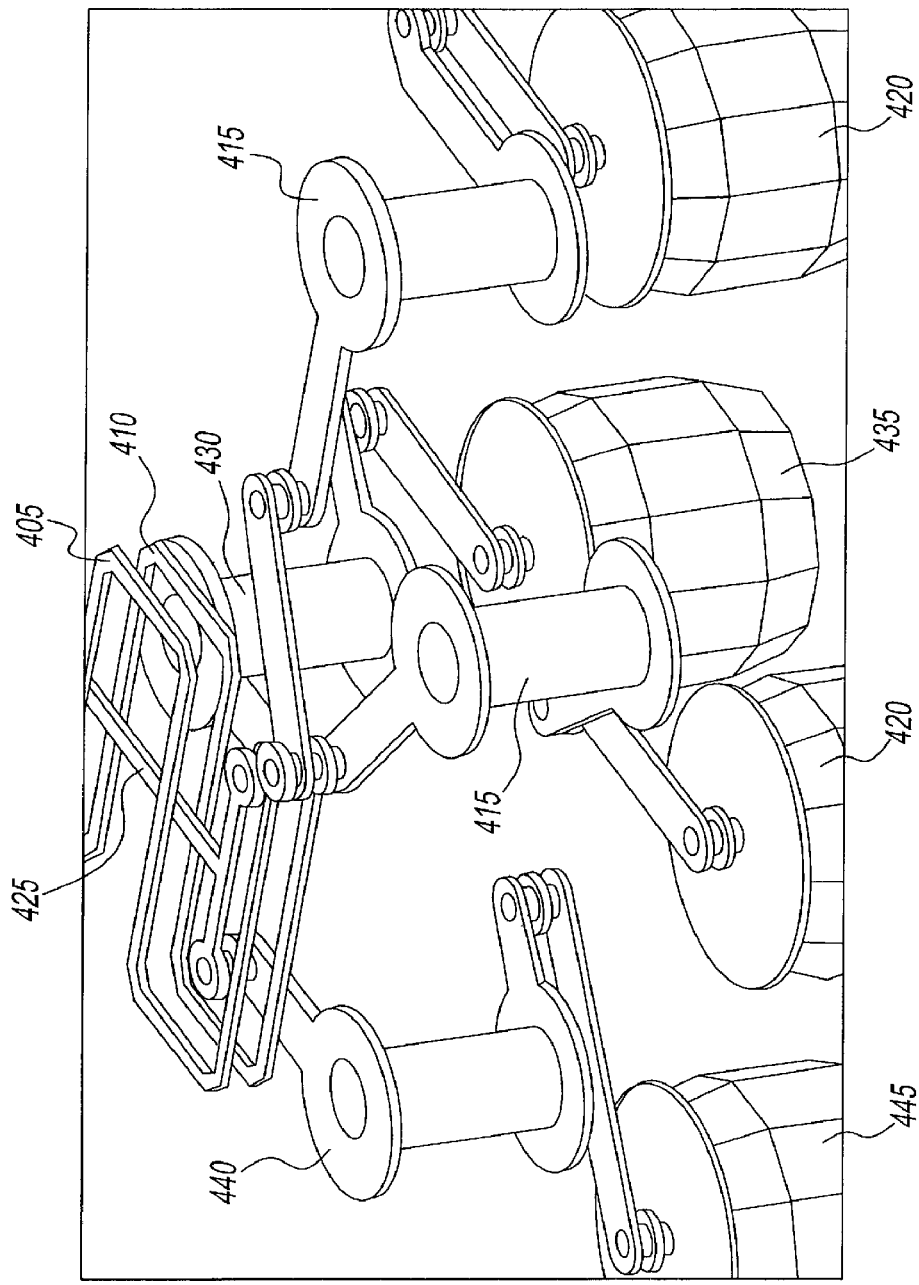
FIG. 4C is a close-up of a region 401 of the embodiment of test vehicle 100 shown in FIG. 4A.

Referring to FIGS. 4A-4C, the features of test vehicle 100 include two orthogonal lines 405 and 410 connected to vias 415 and features 420. As shown in FIG. 4A, test vehicle 100 includes a first end region 401 and a second end region 402. Vias 415 and 420 are connected to at least a power supply (not shown). Temperature sensing line 425 is linear and is located in a layer of substrate 105 between the layers in which lines 405 and 410 are located. Temperature sensing line 425 is also located in between the substantially 90 degree turns of lines 405 and 410. Temperature sensing line 425 is connected to vias 430 and features 435 which are in turn connected to a voltmeter (not shown). Temperature sensing line 425 is also connected to vias 440 and features 445 which are connected to a power supply (not shown) and an ammeter (not shown).

FIG. 4B is a close-up three-dimensional view of the features of FIG. 4A. FIG. 4C is a close-up view of first region 401. FIG. 4C shows orthogonal lines 405 and 410 connected to vias 415 and features 420. Also shown are vias 430 and 440, and features 435 and 445.

In a preferred embodiment, lines 405 and 410, vias 415, features 420, temperature sensing line 425, vias 430, features 435, vias 440 and features 445 are made from a conducting material such as copper.

Figure 5A:
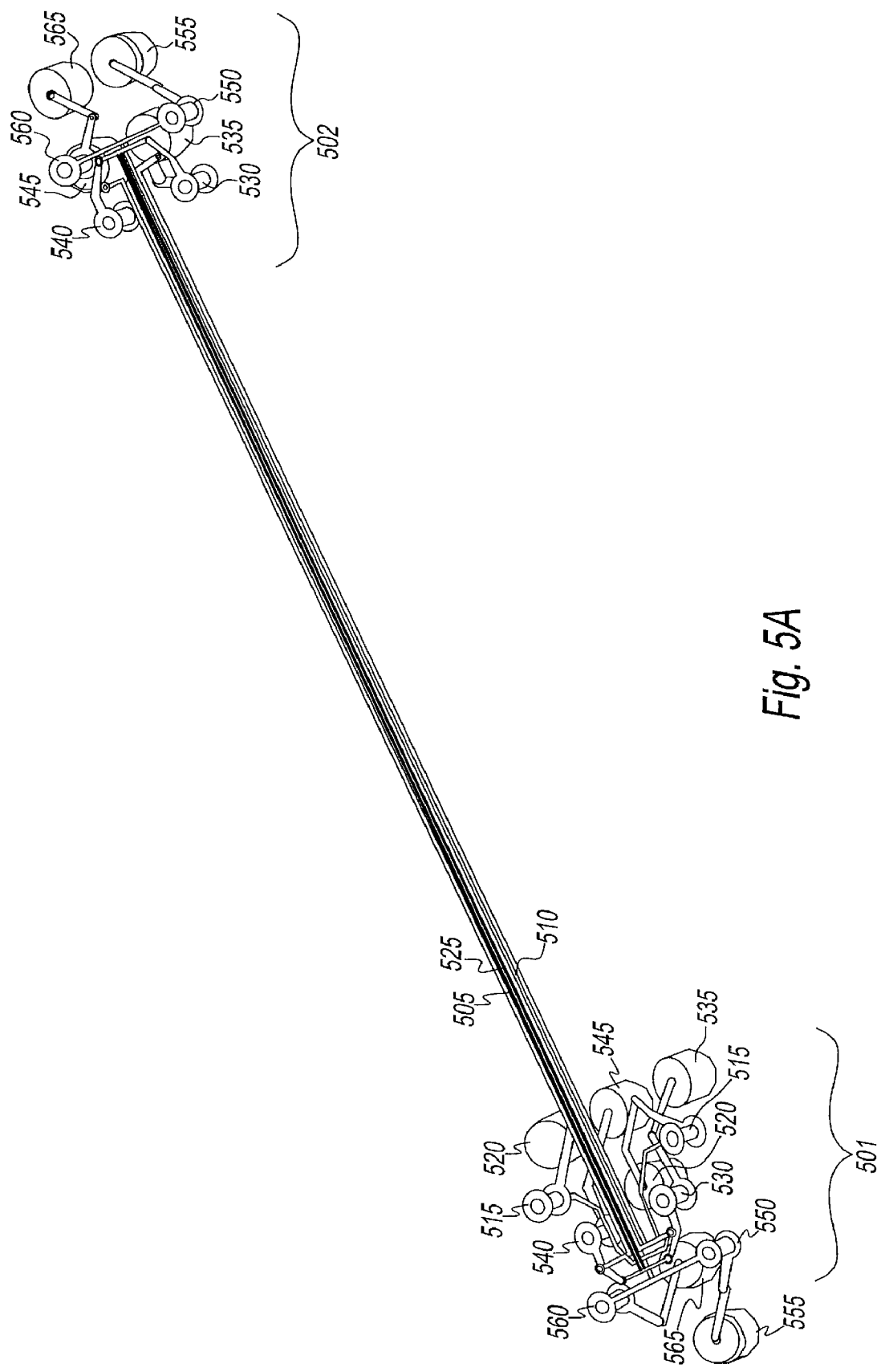
FIG. 5A is a perspective view of an embodiment of the features and test measurement line of test vehicle 100.
Figure 5B:
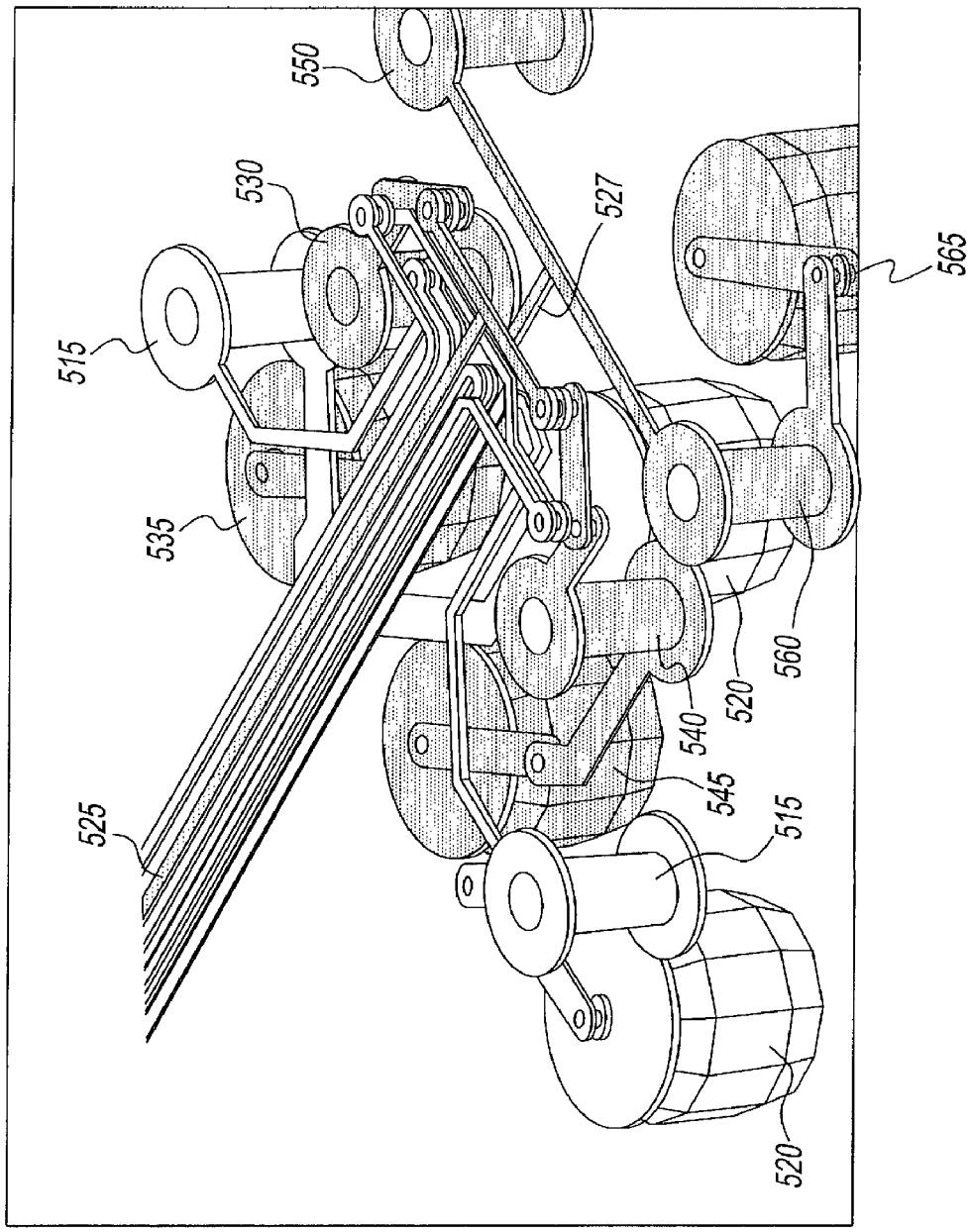
FIG. 5B is a close-up of a region 501 of the embodiment of test vehicle 100 shown in FIG. 5A.
Figure 5C:
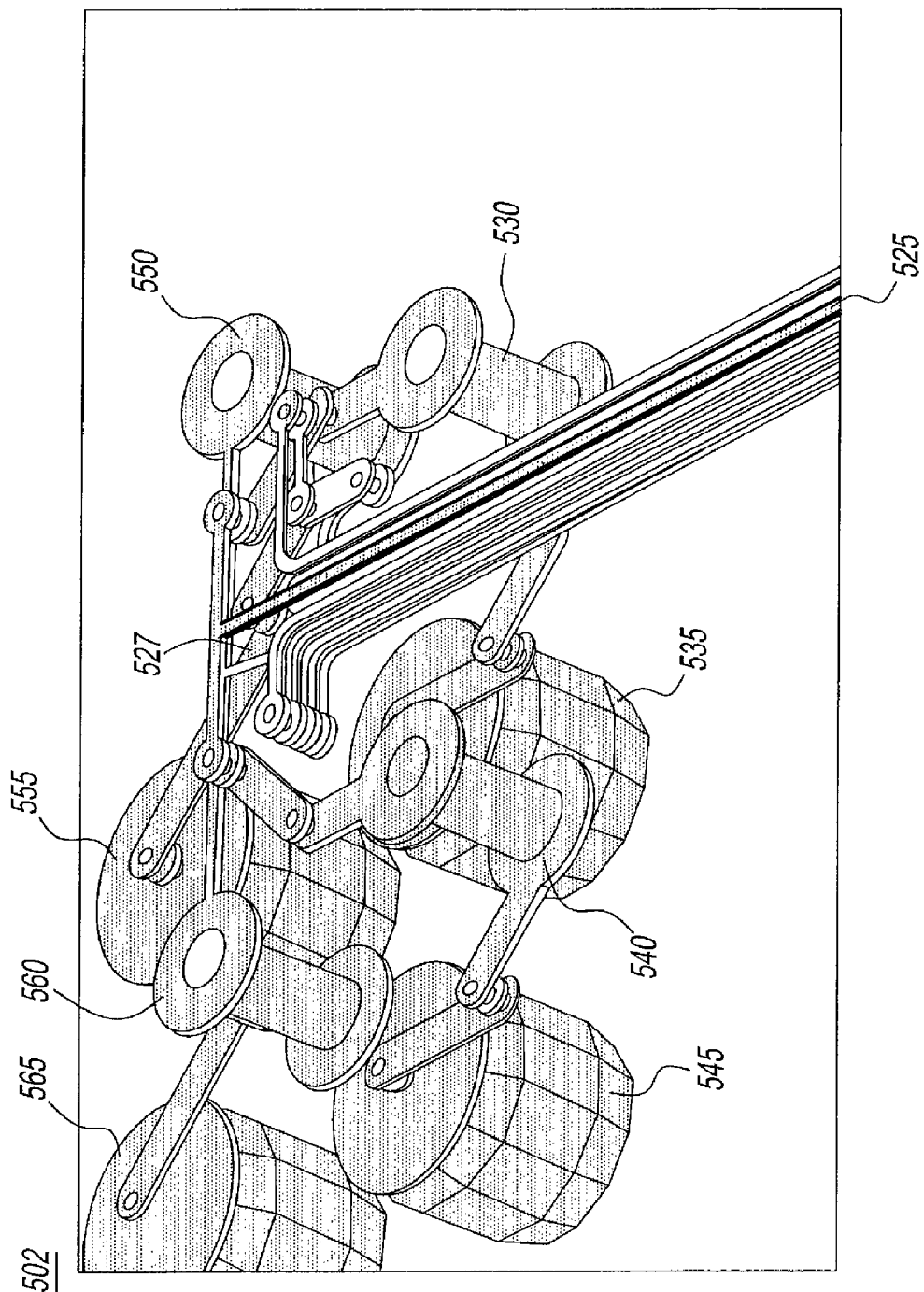
FIG. 5C is a close-up of a region 502 of the embodiment of test vehicle 100 shown in FIG. 5A.

Referring to FIGS. 5A-5C, the features of test vehicle 100 include a long single heater line 505 connected to vias 515 and features 520 routed to fill all available three-dimensional spaces around thermal sensing lines such as temperature sensing lines 525 and 527. In a preferred embodiment with 4 available layers, sensing lines can be placed into the top and bottom layer of the stack, while heating lines are placed in the layers between. Heating lines can also be placed along and proximate to sensing lines on the same layers. In another embodiment, a reversed combination is employed, where all the sensing lines are fully embedded within the available layers stack and heating lines fill all spaces available surrounding completely the victim lines, i.e., heating lines. With long lines used as heaters, and three dimensional surrounding structures partitioned in segments, differential heating effects can be observed when current is allow to flow only in selected segments.

As shown in FIG. 5A, test vehicle 100 includes a first end region 501 and a second end region 502. Test vehicle 100 also includes two temperature sensing lines 525 and 527 (indicated in FIG. 5B), both of which are located between the first group of lines 505 and the second group of lines 510. In this embodiment, first temperature sensing line 525 is located above second temperature sensing line 527.

First temperature sensing line 525 is connected to vias 530 and features 535 which are in turn connected in series to a voltmeter (not shown). First temperature sensing line 525 is also connected to vias 540 and features 545 which are connected in series to a power supply (not shown) and an ammeter (not shown).

Similarly, second temperature sensing line 527 is connected to vias 550 and features 555 which are in turn connected to a voltmeter (not shown). Second temperature sensing line 527 is also connected to vias 560 and features 565 which are connected in series to a power supply (not shown) and an ammeter (not shown).

FIG. 5B is a close-up view of first end region 501 of test vehicle 100. FIG. 5C is a close-up view of second end region 502.

In a preferred embodiment, lines 505 and 510, vias 515, features 520, temperature sensing line 525 and 527, vias 530 and 540, features 535 and 545, vias 550 and 560, and features 555 and 565 are made from a conducting material such as copper.

Figure 6A:
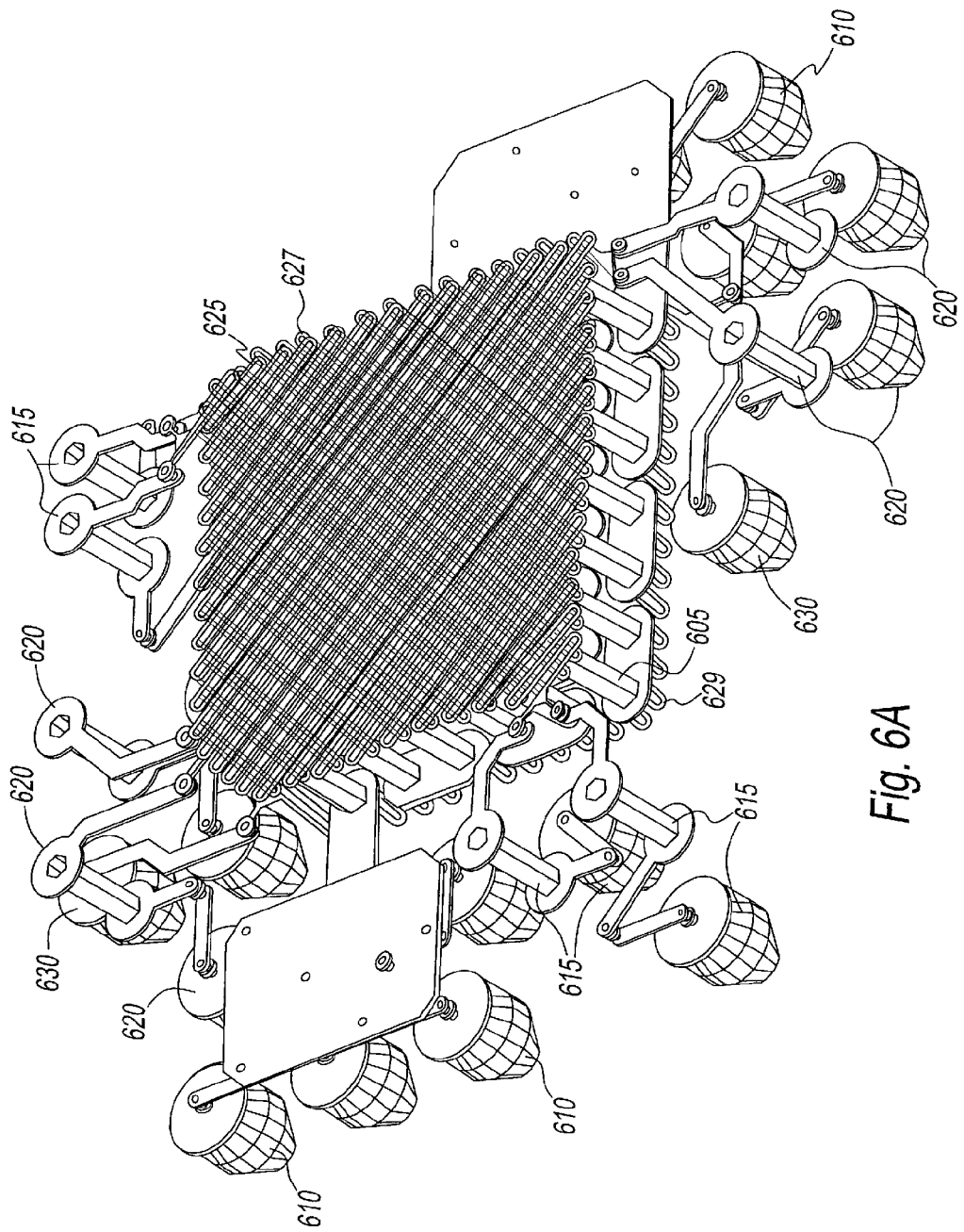
FIG. 6A is a perspective view of an embodiment of the features and test measurement line of test vehicle 100.
Figure 6B:
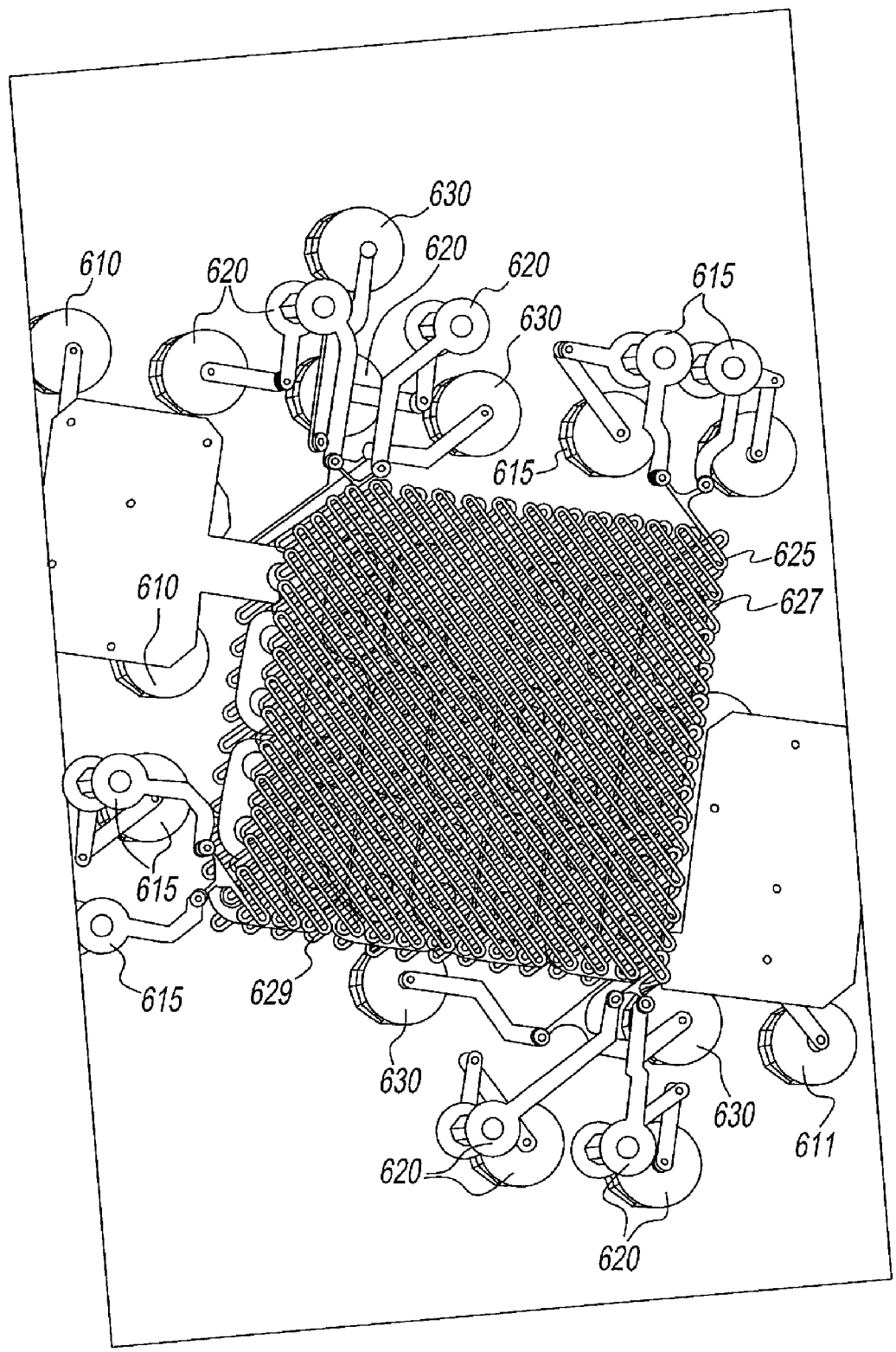
FIG. 6B is another perspective view of the embodiment of test vehicle 100 shown in FIG. 6A.
Figure 6C:
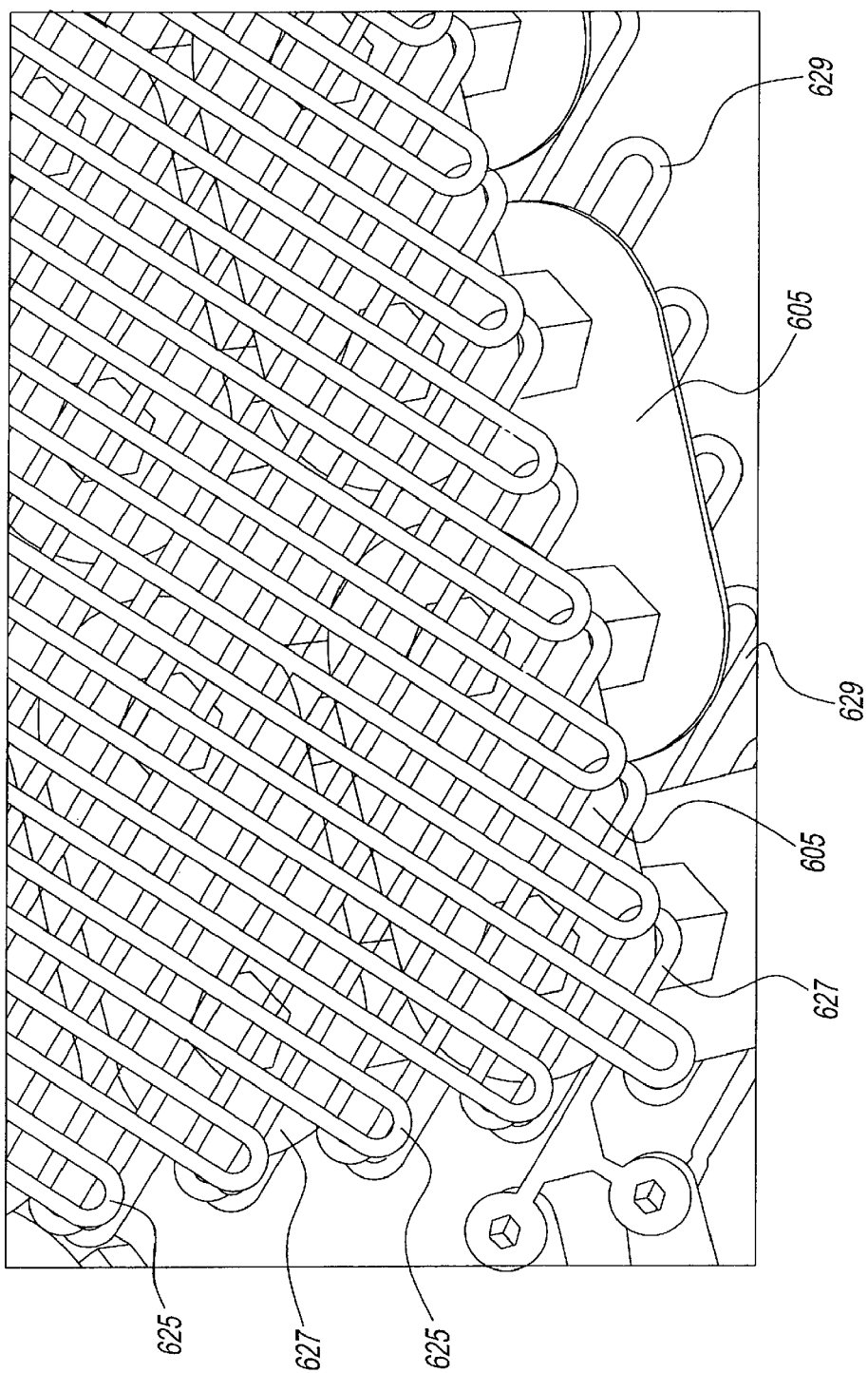
FIG. 6C is a close-up of the embodiment of test vehicle 100 shown in FIG. 6A.

Referring to FIGS. 6A-6C, test vehicle 100 includes features in the form of an array of Resin Filled Plated through holes, i.e., RFP's, 605. In the current embodiment, test vehicle 100 also includes three temperature sensing lines 625, 627 and 629, each of which frequently doubles back and weaves back and forth so as to cover an area defined by a surface of the array of RFP's 605. Temperature sensing lines 625 and 627 are located above the array of RFPs 605 to monitor temperature gradients generated by the RFP matrix or inversely to monitor temperature gradients when heat is generated from the active semiconductor device or combinations of both phenomena. Temperature sensing lines 625 and 627 form a cross-hatch pattern. A similar temperature sensing line 629 is located on an opposite surface below the array of RFPs 605. As shown in FIGS. 6A and 6B, RFP's 605 are connected to features 610 for connection to a power source (not shown).

Temperature sensing line 625 is connected to features 615, temperature sensing line 627 is connected to features 620, and temperature sensing line 629 is connected to features 630. Similar to the above embodiments shown in FIGS. 3A-5C, each temperature sensing line is connected to the respective features for measurement of temperature change, and each line is connected to an ammeter, voltmeter and power source as described above.

FIG. 6C is a three-dimensional close-up view of temperature sensing lines 625, 627 and 629, and also of RFPs 605.

In a preferred embodiment, lines 625, 627 and 629, and features 610, 615, 620 and 630 are formed from a conducting material such as copper.

Figure 7:
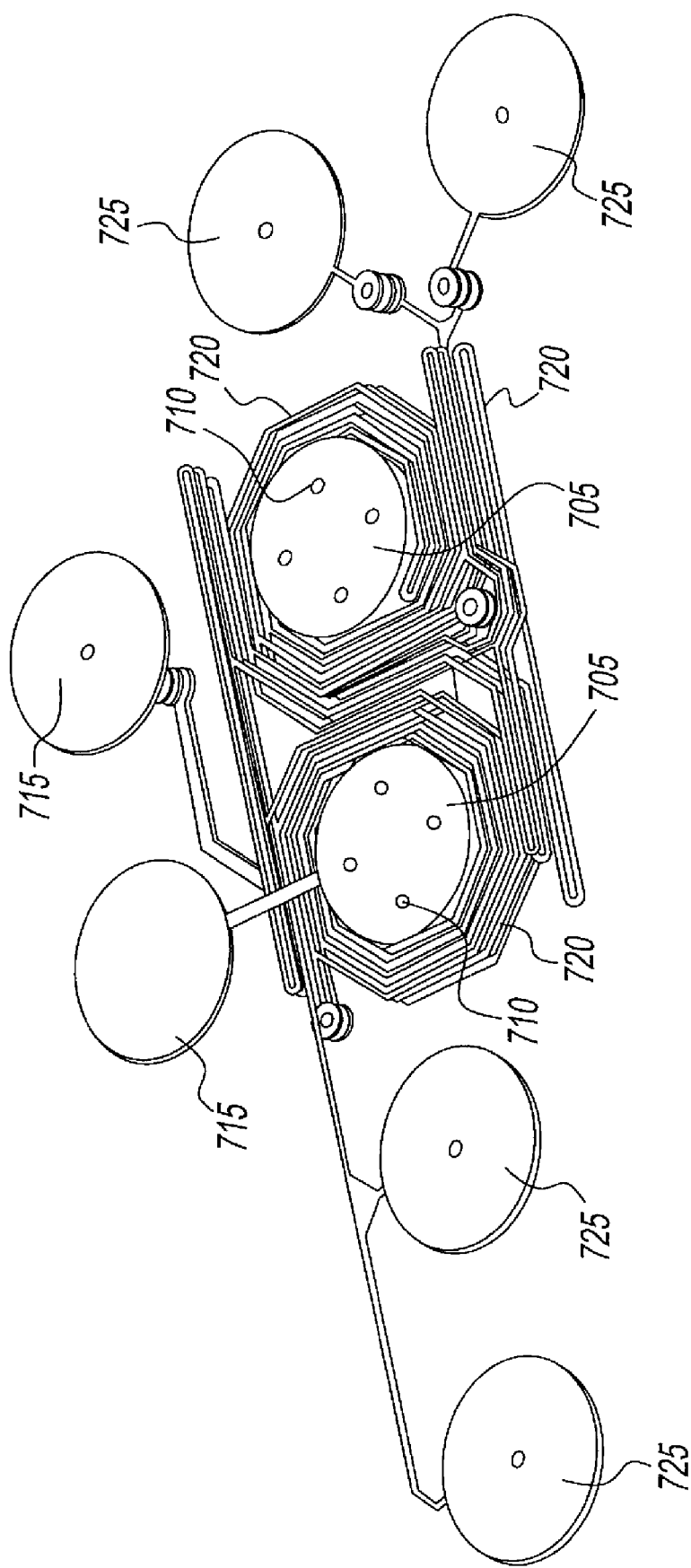
FIG. 7 is a perspective view of an embodiment of the features and test measurement line of test vehicle 100.

FIG. 7 shows another embodiment of test vehicle 100 including stacked disc features 705 having multiple laser via holes 710 and connected to features 715 for connection to a power supply (not shown). Laser vias 710 connect the numerous stacked discs 705 located in numerous layers of the substrate of test vehicle 100. Discs 705 can be connected with a variable number of laser vias; this allows for the creation of a matrix of features having different electrical resistance values based on different interconnection schemes. When exercised with a known amount of current, different thermal gradients contributed by different features are measured to help define the level of redundancy required to deliver the necessary current to the electrical circuit within the module. Also included is a lateral long spiral sensor line 720 that creates a single victim line thermal sensor. Line 720 extends across all layers of interest around stacked discs 705. Line 720 is a continuous long line wrapped around the vertically stacked discs 705. As in previous embodiments, temperature sensing line 720 is connected to features 725 for connection as a four-point probe.

Sensor line 720 surrounds each of stacked disc features 705 and extends through all layers of the laminate that are of interest. Preferably, sensor line wraps around stacked disc features 725 in each layer in which portions of stacked disc features 705 are located. This structural configuration is used to define the capabilities of each tested feature to deliver currents to power planes embedded in the laminate layers at a location away from the outer available two positions of features 715.

Figure 8:
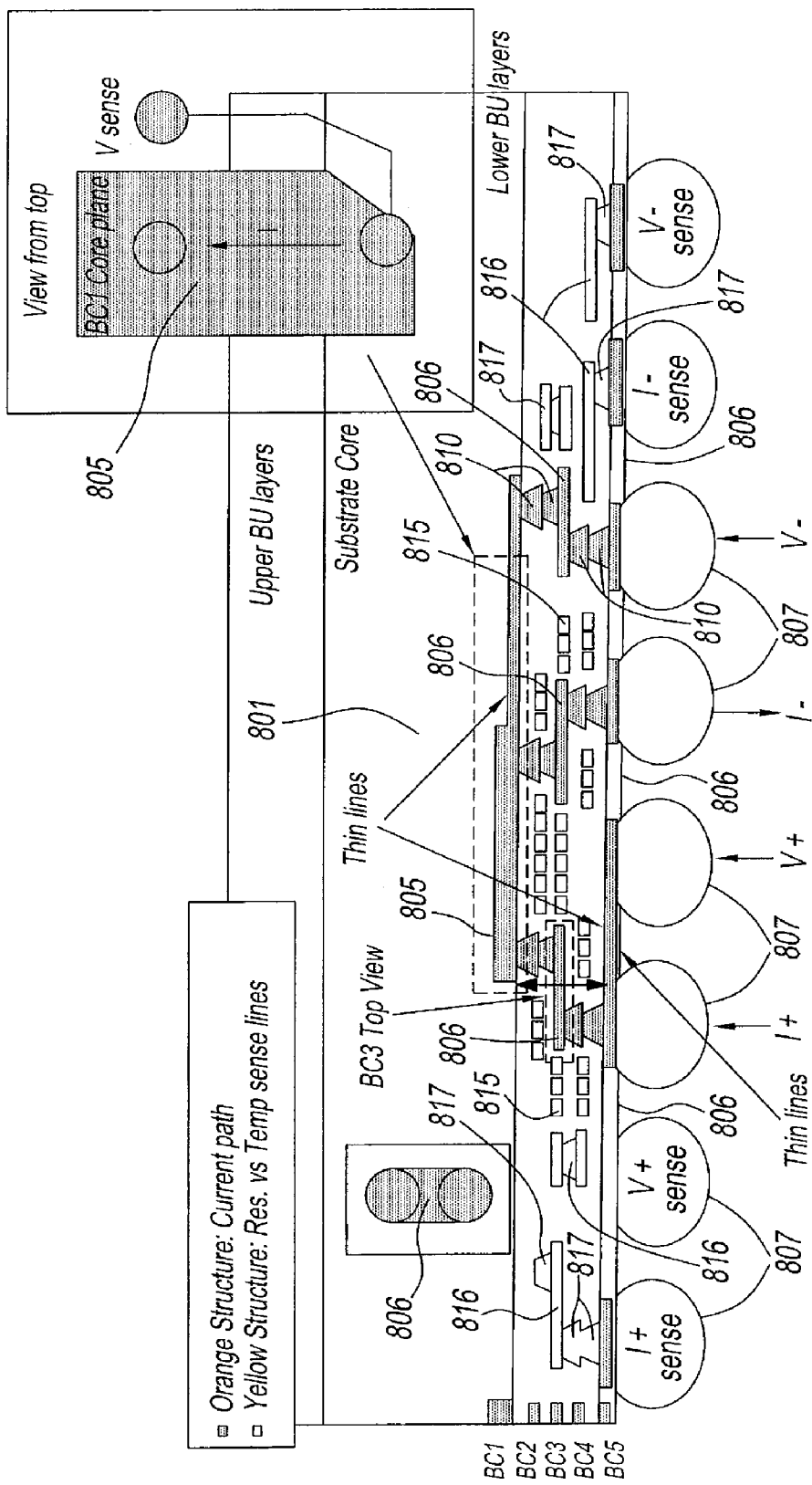
FIG. 8 is a side view of an embodiment of the features and test measurement line of test vehicle 100.

FIG. 8 is a side view of another embodiment of test vehicle 100. In FIG. 8, only layers BC1, BC2, BC3, BC4 and BC5 are shown. Conductive feature 801 includes conductive plate 805, located in core layer BC1, and conductive plates 806, located at layers BC3 and BC5. Plates 805 and 806 are connected to each other and to conductive balls 807 that provide voltage and current, through vias 810. Sensing lines 815 are serpentine and are configured to surround all of the vertical structures, including vias 810 and plates 806, for resistance and temperature sensing. Lines 815 are electrically connected to some or all of conductive balls 807, through structures 816 and vias 817.

The materials, layers and features of test vehicle 100 are constructed so that a desired semiconductor packaging laminate is replicated, substantially replicated, or approximated. Features are provided that replicate or approximate those features typically found in packaging laminates. The features include micro-vias, lines, through holes, RFPs and other conductive features having use in a semiconductor packaging substrate. The features are matched to at least one preferred conducting feature in a preferred semiconductor packaging substrate.

In one embodiment, test vehicle includes a plurality of conducting features. In another embodiment, multiple features are connected together into one or more clusters.

The measurement device measures a change in resistance of the feature as a result of the current. In one embodiment, the measurement device is connected to a processor that determines the change in temperature based on changes in resistance in the sensing lines. The processor may be part of a desktop or portable computer or other computing system.

The present invention provides a build-up laminate, i.e. substrate, test vehicle to measure resistive heating of a variety of common design features in the laminate of a semiconductor package. In addition, a corresponding test method is provided to effectively test the thermal effects of high power currents on the packaging laminate, as well as test the long term reliability implications of passing a known amount of current through the laminate and subjecting the package to repeated on-off cycles.

The present invention also provides a method for determining resistive heating in common laminate design features. The method is effective for determining both the thermal effects of current applied to laminate or packaging substrate, as well as the reliability of substrate materials due to prolonged heating and/or persistent power cycling.

The method includes incorporating one or more conductive features into a substrate that includes semiconductor packaging material. The features included in the packaging materials are features as disclosed above. In one embodiment, the substrate is made of multiple layers of an organic material.

The features are preferably common design features of semiconductor packaging substrates, such as micro vias, lines, interconnecting module pads, and resin filled plated through holes (RFP's). These features are individually designed to be representative of common laminate design features, or of specific design features to be used in a selected packaging laminate designs.

In a preferred embodiment, the substrate is made from an organic material. The substrate is preferably semiconductor packaging material used in flip chip plastic ball grid array semiconductor packaging. In another embodiment, the test vehicle may be used in conjunction with other types of packaging, including flip chip plastic ball grid array semiconductor packaging, wire-bond module (WB) packaging, surface mounted technology (SMT) packaging, and various combinations thereof.

Additional packaging includes hybrid (mixed technologies) packages such as combination flip chip attach and wire-bond module (FCA+WB), and combination SMT and WB packaging (SMT+WB). Other packaging includes microcards such as PCMCIA cards, and other types of PCB cards.

The method further includes applying an electric current to one or more of the features incorporated into the substrate, and measuring a change in temperature of a region of the substrate around the feature as a result of the electric current. This method allows for the calculation of a relationship between: 1) current induced in one or more features, and 2) the resulting change in temperature in the surrounding substrate material.

In another embodiment, the method includes incorporating a plurality of conductive features together and electrically connecting the plurality of features into one or more clusters.

The method also includes incorporating one or more temperature sensing lines that can be calibrated and used to measure the temperature immediately in the vicinity of the feature to be studied. The temperature sensing lines are part of a measurement device by which measurement of the change in temperature is achieved.

Increased temperatures in localized micro-regions can lead to different levels of material degradation surrounding the metal traces; these can be simple loss of adhesion to severe charcoaling of the plastic resins. The measured effect is an increase of thermal impedance, which grows greatly when air pockets are generated and result in the heating elements and the surrounding material matrix being no longer in contact. Replicating test conditions at different times allows detecting skews in the measured temperature curves.

In one embodiment, the measurement device measures temperature changes based on a change in the resistance of the temperature sensing line. Measuring the change in temperature is accomplished by measuring a change in a resistance of the feature in response to an applied current, and determining a temperature of the material surrounding the feature based on a relationship between the temperature and the change in resistance.

The method can be used to determine the temperature changing effects of one or more individual features, or of one or more clusters that each includes a plurality of features. The features in each cluster may be identical or may be a variety of types or configurations of features. The contribution of an individual feature can be calculated based on the results obtained for the cluster.

The method may also include initial steps, performed prior to measuring the temperature change, to determine the relationship between resistance and temperature. The initial steps include, prior to applying an electric current to one or more features, heating at least the substrate material surrounding the feature, and measuring a change in a resistance of the feature to determine the relationship between the temperature change and the change in resistance.

This may be accomplished, for example, by initially measuring a resistance of the temperature sensing line at a given temperature, such as room temperature. As discussed above, the temperature sensing line is connected to a power supply, an ammeter and a voltmeter in a four-point probe configuration. A current is applied to the temperature sensing line, and a resistance of the temperature sensing line is calculated based on the applied current and measured voltage. The test vehicle is then placed in an oven and the temperature of the test vehicle is raised to a desired value. After the test vehicle is at a desired temperature, current is again applied to the temperature sensing line and the resistance of the temperature sensing line is calculated at the desired temperature. This process can be repeated for various temperature values as needed to determine the relationship between resistance and temperature.

The temperature distribution in the laminate due to a cluster being heated can be determined by monitoring the temperature sensor lines in other clusters spaced throughout the laminate. Two or more clusters in combination provide the additive effect of current flow through two or more clusters. Finally, the chip can be powered separately such that the relative contributions of the chip power and the resistive heating of the laminate design features can be discerned.

There is also provided a method for determining reliability of packaging materials. This method includes incorporating at least one conducting feature into a substrate that includes the semiconductor packaging material, and determining a maximum current that can be passed through the feature by increasing an electric current through the feature until the feature fails. Such failures may include the inducement of a short circuit or an open circuit.

First, the maximum current which can be passed through a feature can be determined by increasing the current until the feature fails. Failure may occur, for example, because of electromigration of the metal in the feature creating a void. The risk of such a failure can be determined by passing different levels of current through features and monitoring the resistance over time.

In other instances, failures may be due to leakage between features, potentially due to the degradation of the organic dielectric material in the substrate over time when subjected to high temperatures. The risk of such a failure can be assessed by passing known amounts of currents through the laminate features and monitoring the leakage between features over time.

Finally, the risk of failure due to fatigue cracking during on-off cycles can be assessed by subjecting the test vehicle to power cycling. Cycling the amount of current, i.e. varying the amount of current repeatedly over a period of time, can subject the test vehicle to different extremes of temperature as determined by the calculated relationship between temperature and current in the features. Subjecting the test vehicle to such power cycling allows for the determination of a risk of failure of a selected packaging substrate due to power cycling.

The present invention provides an effective device and method to understand the limitations of organic packaging materials, especially those materials used in high current, high power solutions. The test vehicle design, preferably an organic laminate FCPBGA TV design, and the test methodology can be used in combination to perform detailed studies of the long term reliability concerns for using FCBPGA packages for high power chips.

It should be understood that various alternatives, combinations and modifications of the teachings described herein could be devised by those skilled in the art. The present invention is intended to embrace all such alternatives, modifications and variances that fall within the scope of the appended claims.

What is claimed is:

1. A method for measuring thermal properties of a semiconductor packaging material, comprising:
   incorporating at least one conducting feature into a substrate that includes said semiconductor packaging material;
   applying an electric current to said feature;
   prior to said applying said electric current to said feature, heating at least said substrate material surrounding said feature to create a temperature change, and measuring a change in a resistance of said feature to determine a relationship between said temperature change and said change in resistance; and
   measuring a change in temperature of a region of said substrate around said feature as a result of applying said electric current to said feature.

2. The method of claim 1, wherein said substrate is made from an organic material.

3. The method of claim 1, wherein said semiconductor packaging material is used in packaging selected from the group consisting of flip chip plastic ball grid array semiconductor packaging, wire-bond module (WB) packaging, surface mounted technology (SMT) packaging, FCA, PCB cards, micro-cards, and any combinations thereof.

4. The method of claim 1, wherein said features are selected from the group consisting of: micro-vias, lines, through holes, interconnecting module pads, and any combinations thereof.

5. The method of claim 4, wherein said at least one conducting feature is a plurality of conducting features electrically connected in at least one cluster.

6. The method of claim 1, wherein said measuring said change in temperature is accomplished by:
   measuring a second change in a resistance of said feature in response to said current;
   determining a temperature of said material surrounding said feature based on said relationship between said temperature and said second change in resistance.

7. The method of claim 1, wherein said at least one conducting feature is matched to at least one preferred conducting feature in a preferred semiconductor packaging substrate.

8. A method for measuring thermal properties of a semiconductor packaging material, comprising:
   incorporating a conducting feature into a substrate of a test vehicle;
   placing said test vehicle in an oven to heat said test vehicle;
   determining a resistance change in said conducting feature as a result of heating said of test vehicle;
   applying an electric current to said conductive feature after determining said resistance change; and
   measuring a change in temperature of a region of said substrate around said conductive feature as a result of applying said electric current to said conductive feature.

9. A method for measuring thermal properties of a semiconductor packaging material, comprising:
   placing a test vehicle having a conductive feature incorporated into a substrate into an oven;
   heating via said oven, prior to applying an electric current to said conductive feature, at least said substrate material surrounding said feature so as to induce a temperature change in said conductive feature;

determining a relationship between said temperature change and a change in resistance for said conductive feature;

applying said electric current to said conductive feature after determining said relationship; and measuring a change in temperature of a region of said substrate around said conductive feature as a result of applying said electric current to said conductive feature.

10. The method of claim 8, wherein said conducting feature is matched to a preferred conducting feature in a preferred semiconductor packaging substrate.

11. The method of claim 9, wherein said conducting feature is matched to a preferred conducting feature in a preferred semiconductor packaging substrate.

* * * * *